United States Patent
de Heer et al.

(10) Patent No.: US 8,460,764 B2
(45) Date of Patent: Jun. 11, 2013

(54) METHOD AND APPARATUS FOR PRODUCING ULTRA-THIN GRAPHITIC LAYERS

(75) Inventors: Walt A. de Heer, Atlanta, GA (US); Xuebin Li, Santa Clara, CA (US); Michael Sprinkle, Mableton, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 914 days.

(21) Appl. No.: 12/397,894

(22) Filed: Mar. 4, 2009

(65) Prior Publication Data

US 2009/0226638 A1   Sep. 10, 2009

Related U.S. Application Data

(60) Provisional application No. 61/037,579, filed on Mar. 18, 2008, provisional application No. 61/034,240, filed on Mar. 6, 2008.

(51) Int. Cl.
*C23C 14/28* (2006.01)
*H05B 6/00* (2006.01)

(52) U.S. Cl.
USPC .......................................... 427/595; 427/591

(58) Field of Classification Search
USPC ................................................. 427/591, 595
See application file for complete search history.

(56) References Cited

U.S. PATENT DOCUMENTS

| | | | |
|---|---|---|---|
| 3,791,887 A * | 2/1974 | Deitch | 117/67 |
| 4,866,005 A * | 9/1989 | Davis et al. | 117/98 |
| 4,898,557 A | 2/1990 | Engemann | |
| 5,119,541 A * | 6/1992 | Ohmi et al. | 29/25.02 |
| 5,647,998 A | 7/1997 | Potter | |
| 6,113,692 A * | 9/2000 | Jaussaud et al. | 117/105 |
| 6,136,160 A | 10/2000 | Hrkut et al. | |
| 6,159,558 A | 12/2000 | Wolfe et al. | |
| 6,391,109 B2 * | 5/2002 | Shiomi et al. | 117/200 |
| 6,515,339 B2 | 2/2003 | Shin et al. | |
| 6,540,972 B1 | 4/2003 | Hiura | |
| 6,780,243 B1 * | 8/2004 | Wang et al. | 117/105 |
| 7,015,142 B2 | 3/2006 | DeHeer et al. | |
| 7,327,000 B2 | 2/2008 | DeHeer et al. | |
| 7,794,842 B2 * | 9/2010 | Nakabayashi et al. | 428/446 |
| 2004/0253820 A1 * | 12/2004 | DeHeer et al. | 438/689 |
| 2006/0140846 A1 * | 6/2006 | Leis et al. | 423/445 R |
| 2006/0249073 A1 * | 11/2006 | Asaoka et al. | 117/84 |
| 2007/0287011 A1 | 12/2007 | DeHeer | |

OTHER PUBLICATIONS

Shuman et al., Graphitization of Porous 6H-SiC Layers during Thermal Treatment in Vacuum, Technical Physics Letters, vol. 30, No. 7, 2004, pp. 572-574.*

(Continued)

*Primary Examiner* — Timothy Meeks
*Assistant Examiner* — Michael P Rodriguez
(74) *Attorney, Agent, or Firm* — Bryan W. Bockhop; Bockhop & Associates, LLC

(57) ABSTRACT

In a method of producing ultra-thin graphitic layers, a carbide crystal is placed into a graphitic enclosure. The carbide crystal and the graphitic enclosure are placed into a chamber. The carbide crystal and the graphitic enclosure are subjected to a predetermined environment. Once the predetermined environment is established, the carbide crystal and the graphitic enclosure are heated to a first temperature for a predetermined period of time sufficient to cause at least one non-carbon element to evaporate from a crystal face of the carbide crystal so as to form at least one graphitic layer on the crystal face of the carbide crystal.

13 Claims, 3 Drawing Sheets

OTHER PUBLICATIONS

Ohtani et al., Large High-Quality Silicon Carbide Single Crystal Substrates, Nippon Steel Technical Report No. 84, Jul. 2001.*

Berger et al., Ultrathin Epitaxial Graphite: 2D Electron Gas Properties and a Route Toward Graphene-based Nanoelectronics, J. Phys. Chem., vol. 108, 2004, pp. 19912-19916.*

Badami et al., Graphitization of alpha-Silicon Carbide, Nature, vol. 193, Feb. 10, 1962, pp. 569-570.*

Berger et al., Electronic Confinement and Coherence in Patterned Epitaxial Graphene, Science, vol. 312, May 26, 2006, pp. 1191-1196.*

Charrier et al., Solid-state Decomposition of Silicon Carbide for Growing Ultra-thin Heteroepitaxial Graphite Films, Journal of Applied Physics, vol. 92, No. 5, Sep. 1, 2002, pp. 2479-2484.*

Drowart et al., Thermodynamic Study of SiC Utilizing a Mass Spectrometer, The Journal of Chemical Physics, vol. 29, No. 5, Nov. 1958, pp. 1015-1021.*

Rollings et al., Synthesis and characterization of atomically thin graphite films on a silicon carbide substrate, Journal of Physics and Chemistry of Solids, vol. 67, 2006, pp. 2172-2177.*

Jones et al., "Annealing ion implanted SiC with an AlN cap," Materials Science and Engineering B61-62 (1999), pp. 281-286, Elsevier.

Bachtold et al., "Logic circuits with carbon nanotube transistors," Science (2001), vol. 294, p. 1317.

Charrier et al., "Solid-state decomposition of silicon carbide for growing ultra-thin heteroepitaxial graphite films," Journal of App Physics (2002), p. 2479, vol. 92.

Fuhrer et al., "High-mobility nanotube transistor memory," Nano Letters (2002), p. 755, vol. 2, No. 7.

Javey et al., "Ballistic carbon nanotube field-effect transistors," Nature (2003), p. 654, vol. 424.

Kempa et al., "A field effect transistor from graphite," EPJ Manuscript (2003).

Mintmire et al., "Universal density of states for carbon nanotubes," Physical Review Letters (1998), p. 2506, vol. 81, No. 12.

Nakada et al., "Edge state in graphene ribbons," Physical Review B, (1996), p. 17954, vol. 54, No. 24.

Poncharal et al., "Room temperature ballistic conduction in carbon nanotubes," J. Phys. Chem. B (2002), p. 12104.

Wakabayashi, "Electronic transport properties of nanographite ribbon junctions," Physical Review B (2001), p. 125428-1, vol. 64.

Frank et al., "Carbon nanotube quantum resistors," Science (1998), p. 1744, vol. 280.

* cited by examiner

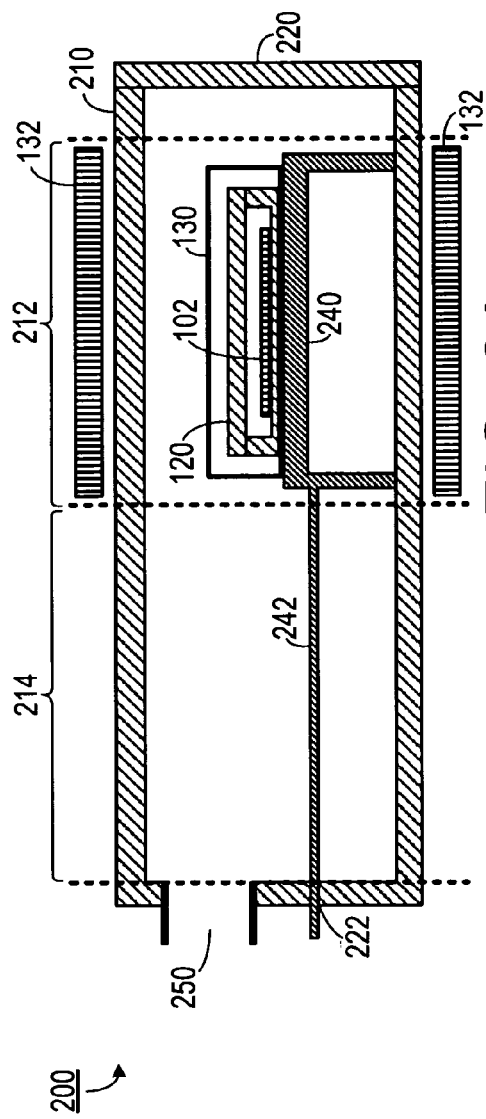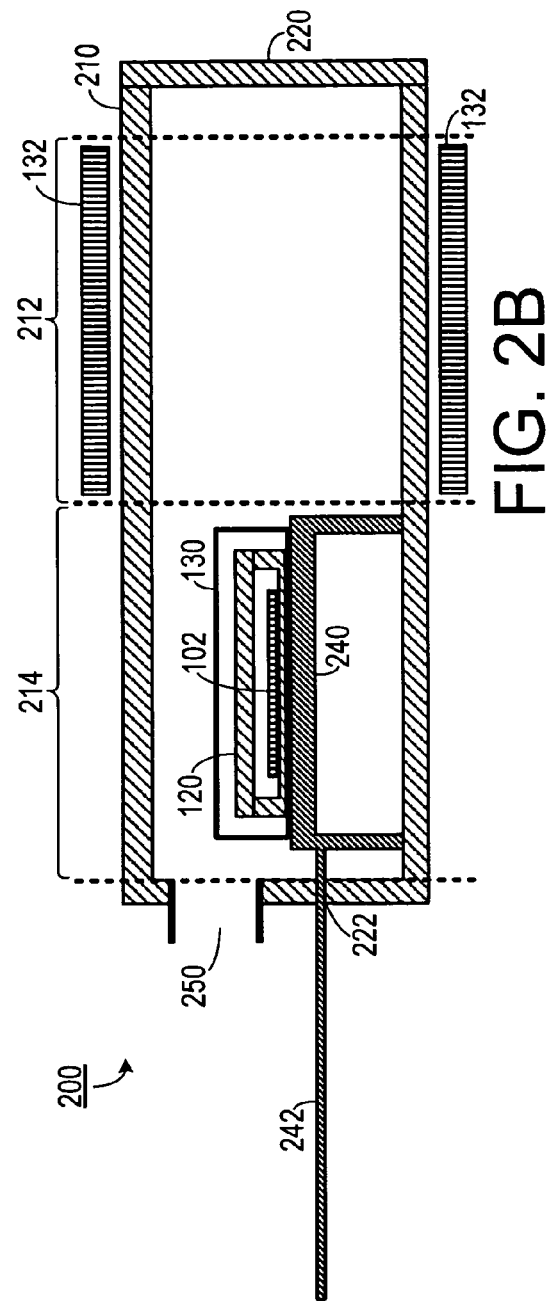

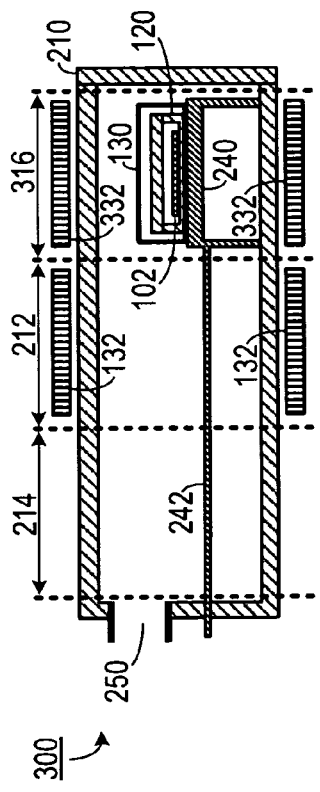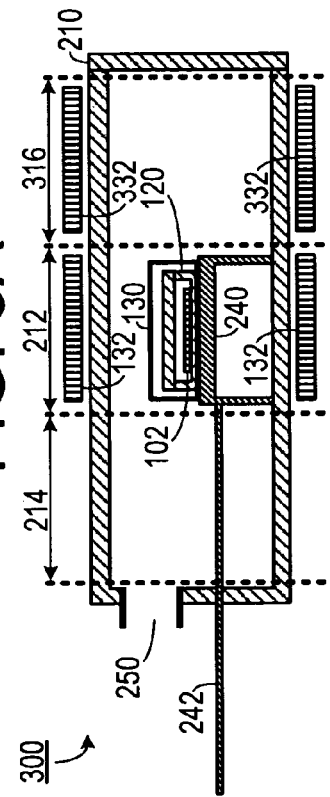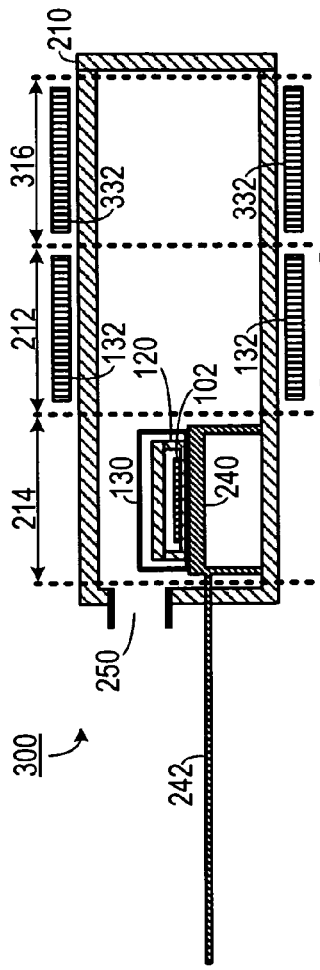

METHOD AND APPARATUS FOR PRODUCING ULTRA-THIN GRAPHITIC LAYERS

CROSS-REFERENCE TO RELATED APPLICATION(S)

This application claims the benefit of U.S. Provisional Patent Application Ser. No. 61/037,579, filed Mar. 18, 2008, and U.S. Provisional Patent Application Ser. No. 61/034,240, filed Mar. 6, 2008, the entirety of each of which is hereby incorporated herein by reference.

STATEMENT OF GOVERNMENT INTEREST

This invention was made with Government support under agreement number ECS-0404084, awarded by the National Science Foundation. The Government has certain rights in the invention

BACKGROUND OF THE INVENTION

1. Field of the Invention

The present invention relates to thin film graphitic systems and, more specifically, to a method of growing ultra-thin graphitic layers.

2. Description of the Prior Art

Graphene is a semimetal consisting of a single atomically thin sheet of graphite. As used here, "ultra-thin graphitic layer" includes one or more (e.g., up to 300) graphene sheets. An ultra-thin graphitic layer may be on a silicon carbide substrate. Ultra-thin graphitic layers have a potential use as charge transporting and semiconductor materials for microelectronics.

Ultra-thin graphitic layers form on silicon carbide crystal substrates when the silicon carbide substrate is heated in a vacuum to temperatures in the range of 1100° C. to 2000° C. At this temperature, silicon evaporates from the surface causing the surface to become carbon rich. Carbon on the surface is stable as an ultra-thin graphitic layer. Typically, ultra-thin graphitic layers are grown on silicon carbide crystals by heating the crystals in ultra-high vacuum at high temperatures. The growth process involved the sublimation of silicon from the silicon carbide surface so that the surface becomes carbon rich. The carbon at the surface then forms graphitic layers.

The properties of ultra-thin graphitic layers grown on silicon carbide crystals are essentially the same as those of a single graphene sheet. Ultra-thin graphitic layers on silicon carbide crystals can be patterned using existing microelectronics lithography methods to produce electronically functional structures. Consequently, as for a single graphene sheet, ultra-thin graphitic layers grown on silicon carbide crystals can be used as an electronic material.

For graphene and multilayered graphene to become semiconducting for use in electronic applications, the multilayered graphene should be patterned into ribbons that are typically narrower than about 20 nm. To produce ribbons that are this narrow, non-standard nanofabrication techniques are employed. However, many such techniques are difficult to implement for large-scale production.

The graphene sheet that is in contact with the silicon carbide substrate is called the "interface layer." The interface layer acquires an electronic charge, whereas the other graphene layers are substantially uncharged. Due to this charge, the conductivity of the interface layer is particularly large and therefore carries most of the current when voltages are applied to multilayered graphene ribbons. While this conducting interface layer has advantages for some applications, it is disadvantageous for many electronic device structures.

Growing ultra-thin graphitic layers on silicon carbide crystals using the ultrahigh vacuum method mentioned above can be a time consuming and complex process. This is because the silicon carbide crystal has to be introduced into an ultra-high vacuum system, in which the residual gas pressures are below $10^{-9}$ Torr, which is difficult to achieve at a large scale. Also, it is difficult to elevate the temperatures of a vacuum chamber uniformly so that all of the silicon carbide crystal heats to the high temperature required for the formation of high-quality ultra-thin graphitic layers. Furthermore, the quality of the ultra-thin graphitic layers grown using an ultra-high vacuum chamber tends to be poor and the ultra-thin graphitic layers show evidence of degradation, possibly due to chemical reactions with residual background gasses. Thus, defects are common in such ultra-thin graphitic layers.

Therefore, there is a need for method of creating ultra-thin graphitic layers on a large scale.

Therefore, there is also a need for method of creating ultra-thin graphitic layers that have few defects.

SUMMARY OF THE INVENTION

The disadvantages of the prior art are overcome by the present invention which, in one aspect, is a method of producing ultra-thin graphitic layers, in which a carbide crystal is placed into a graphitic enclosure. The carbide crystal and the graphitic enclosure are placed into a chamber. The carbide crystal and the graphitic enclosure are subjected to a predetermined environment. Once the predetermined environment is established, the carbide crystal and the graphitic enclosure are heated to a first temperature for a predetermined period of time sufficient to cause at least one non-carbon element to evaporate from a crystal face of the carbide crystal so as to form at least one graphitic layer on the crystal face of the carbide crystal.

In another aspect, the invention is an apparatus for generating a graphitic layer on a crystal face of a silicon carbide crystal. The apparatus includes a non-conductive chamber. A conductive receptacle is disposed in the chamber. A graphitic enclosure is disposed in the conductive receptacle. The graphitic enclosure defines a void therein. The void is configured to receive the silicon carbide crystal therein. A first heating element is disposed about a first zone of the chamber and is configured to heat the graphitic enclosure to a first predetermined temperature.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 2A-2B are cross-sectional views of a second apparatus for growing ultra-thin graphitic layers.

FIGS. 3A-3B are cross-sectional views of a third apparatus for growing ultra-thin graphitic layers.

DETAILED DESCRIPTION OF THE INVENTION

Figure 1:
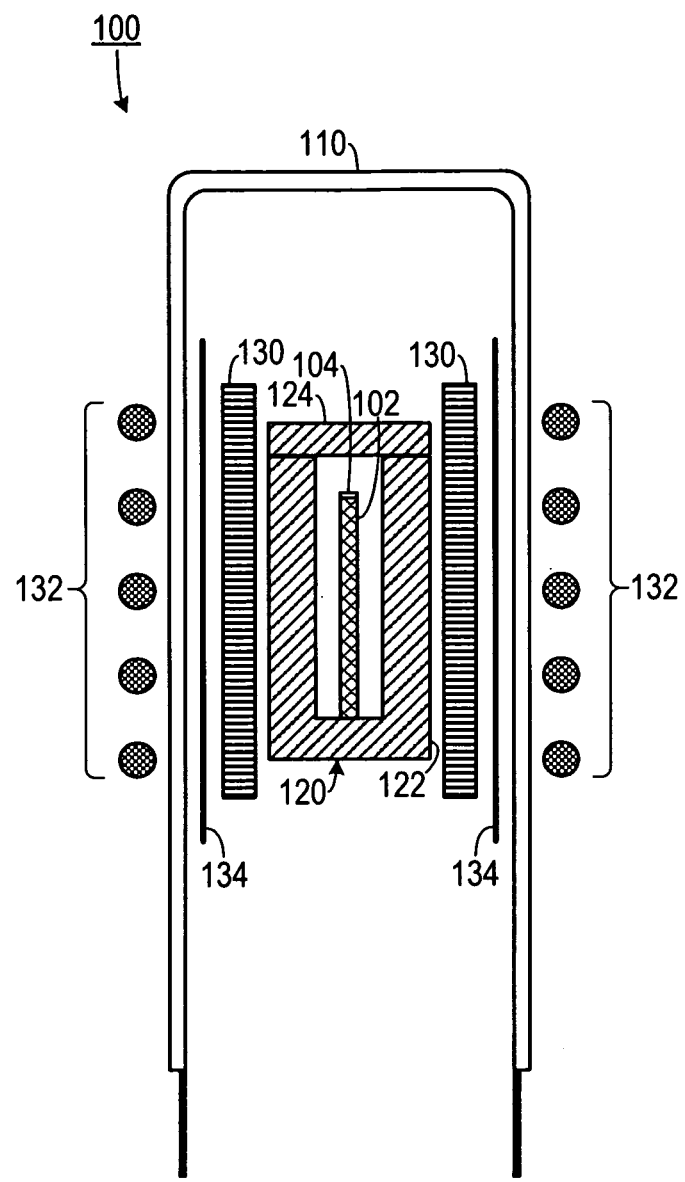
FIG. 1 is a cross-sectional view of a first apparatus for growing ultra-thin graphitic layers.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Growth of multilayered graphene grown on a silicon carbide substrate may be accomplished using several known methods, including an ultra-high vacuum method. One method of growing and patterning multilayered graphene is disclosed in U.S. Pat. No. 7,015,142, issued to de Heer et al., the entirety of which is incorporated by reference for the purposes of disclosing, inter alia, how graphene may be grown on a silicon carbide substrate.

As shown in FIG. 1, in one embodiment, ultra-thin graphitic layers 104 are produced by placing a carbide crystal 102, such as a silicon carbide crystal, into an enclosure, such as a graphite enclosure 120. Prior to placement, a preselected crystal face of the carbide crystal 102 is cleaned and flattened using, for example, hydrogen etching of the crystal face.

The graphite enclosure 120 can have a variety of shapes. In one embodiment, the graphite enclosure 120 includes a cylindrical graphite tube with a length of about 1 inch and a diameter of about 0.5 inch. The bottom of the graphite tube is closed and the top of the tube is supplied with a loosely fitting graphite top. The silicon carbide crystal may include, for example, a rectangular silicon carbide chip that is cut from a single crystal silicon carbide wafer, with a thickness of about 0.5 mm.

In another embodiment, the graphite enclosure 120 is in the form of a rectangular box, for example 2 inches long, 1.5 inches wide and 0.25 inches deep. The graphite enclosure 120 is covered with a graphite top. One or more silicon carbide crystals 102 are placed in the graphite enclosure 120, which is then placed in the chamber 110. The purpose of the graphite enclosure 120 is to provide an environment that is advantageous for the growth of the ultra-thin graphitic film. It is believed that the walls of the graphite enclosure 120 serve to react with residual gases that are present in the chamber 110, thereby removing these corrosive gases or transforming them into gases that will not damage the ultra-thin graphitic layer. These corrosive gases include oxygen and water vapor and can be transformed to carbon monoxide and methane as well as to other gases that will not damage the ultra-thin graphitic film. It is possible that the presence of carbon monoxide and methane may even be beneficial to the production of the ultra-thin graphitic film on the silicon carbide surface. In another embodiment the enclosure includes any material or combination of materials that promote the growth of ultra-thin graphitic films on silicon carbide.

The graphitic enclosure 120 can, for example, include a receptacle 122 made of graphite that defines a void into which the carbide crystal 102 is placed. The receptacle 122 may be sealed with a lid 124, also made of graphite. The enclosure 120 made of graphite reacts with any gaseous reactants that might otherwise act as impurities in the ultra-thin graphitic layers 104 being produced.

The graphitic enclosure 120 is placed into a chamber 110 in which the environment is controllable. For example, the chamber 110 could be a vacuum chamber in which a vacuum (e.g., a pressure that is less than $10^{-2}$ Torr) is established. In an alternate embodiment, the environment includes an inert gas (such as helium or argon at a pressure of about 1 atmosphere). The chamber 110 should be made of a material that can withstand high temperatures and a vacuum. For example, the chamber 110 could be made from quartz, glass or alumina. Once the desired environment is established, the carbide crystal 102 and the graphitic enclosure 120 are heated to a predetermined temperature (for example, a temperature in the range from 1200° C. to 2000° C. in one embodiment). The temperature is maintained for a predetermined period of time sufficient to cause at least one non-carbon element (e.g., silicon) to evaporate from a crystal face of the carbide crystal 102 so as to form at least one graphitic layer 104 on the crystal face of the carbide crystal 102.

In one embodiment, the heating is accomplished with an inductive heating element. In this embodiment, the graphitic enclosure 120 (or, in an alternative embodiment, a silicon carbide enclosure or a molybdenum enclosure is used) is placed into a conductive receptacle 130 prior to being placed in the chamber 110. For example, the conductive receptacle 130 could include molybdenum. A radio frequency conducting coil 132 (such as a copper coil) is placed around the chamber 110 and a radio frequency signal is applied to the coil 132, thereby applying radio frequency radiation to the metal receptacle 130. This causes an increase in the temperature of the metal receptacle 130, thereby heating the carbide crystal 102. A protective heat shield layer 134 (such as a thin metal sheet) may be disposed between the chamber 110 and the metal receptacle 130, thereby protecting the chamber 110 from heat generated at the metal receptacle 130. In another embodiment, the coil 132 may be mounted inside the chamber 110.

One experimental embodiment employed the following steps:
1. A silicon carbide crystal was hydrogen etched to provide clean and flat silicon carbide surface.
2. The silicon carbide crystal was introduced in a graphite enclosure.
3. The chamber was evacuated to its base pressure which is less than $10^{-2}$ Torr and preferably was less than $10^{-5}$ Torr.
4. The graphite enclosure was heated to various temperatures for various times. The heating sequence involves at least one heating phase where the graphite enclosure was heated to a temperature in the range from 1200° C. to 1600° C. for a duration of time ranging from 1 minute to 1 hour. The temperature and durations determined the thickness of the ultra-thin graphitic layer. Longer times and higher temperatures resulted in thicker ultra-thin graphitic layers. For example, in order to produce an ultra-thin graphitic film consisting of about 20 graphene layers on the carbon terminated face of the 6H polytype of silicon carbide, the preferred temperature was 1430° C. and the heating duration was 30 minutes. This heating phase is called the "grapitization heating phase." The silicon carbide crystal was pre-annealed by heating the graphite enclosure to a temperature between 800° C. and 1300° C. prior to the graphitization heating phase. In this pre-annealing phase contaminants were removed from the heated zones and oxides were removed from the crystal surface, resulting in a favorable environment for the production of the ultra-thin graphitic layers.
5. The furnace was cooled and the ultra-thin graphitic layer coated silicon carbide crystal was removed from the furnace.

In another embodiment, as shown in FIGS. 2A-2B, the chamber 210 includes two zones: a first zone 212 and a second zone 214. This embodiment also includes a passage 250 to which a vacuum pump (not shown) or inert gas source (not shown) may be attached. The first zone 212 includes a heating element 132 (such as the radio frequency coils shown) and the second zone 214 does not include a heating mechanism. The vacuum chamber is closed by a lid 220 which is affixed to the chamber 210 by vacuum seal. The lid 220 can be removed to provide access to the interior of chamber 210. The receptacle 130 could include perforations to allow gasses to escape.

The use of the first zone 212 and the second zone 214 allows the carbide crystal 102 to be subjected to two different temperatures: a first temperature and a different second temperature. This is accomplished by placing the receptacle 130 on a movable platform 240 and moving the movable platform 240 from the second zone 214 into the first zone 212 (or vise-versa) with a movement mechanism, such as a handle 242 that extends to the outside of the chamber 210. The platform 240 is made of a material that can withstand high temperatures, such as graphite. The handle 242 extends though a hole 222 in the chamber 210. A vacuum seal prevents air from escaping through the hole 222.

As shown in FIGS. 3A-3C, in yet another embodiment, a third zone 316 may include a second heating element 332 (which could also be a radio frequency coil). This would allow the carbide crystal 102 to be subjected to a heating profile that includes three different temperatures (i.e., the temperature of the first zone 212, the temperature of the second zone 214 and the temperature of the third zone 316). An advantage of this embodiment is that it provides it provides a mechanism to rapidly heat and cool the silicon carbide crystals to predetermined temperatures for predetermined durations of time. As will be appreciated; use of more than two heating zones may be employed, depending upon the specific application.

With this embodiment, the silicon carbide crystal 102 can be subjected to a pre-annealing temperature of (for example) 1200° C. for 30 minutes the first zone 212, after which it is moved to the third zone 316 where it is subjected to another temperature (for example) 1430° C., for another 30 minutes. After this heating, the silicon carbide crystal 102 may be moved to the un-heated second zone 214, where it cools to room temperature.

Another embodiment includes a method to produce high quality ultra-thin graphitic layers using a medium-high-vacuum furnace in which the residual gas pressures that are orders of magnitude higher than in ultra-high vacuum systems. Even though ultra-thin graphitic layers at high temperatures are rapidly destroyed by even low concentrations of reactive gasses which are always present in all vacuum chambers, and more so in vacuum chambers that operate at higher pressures, this embodiment allows for ultra-thin graphitic layers with fewer defects to be grown in a medium-high-vacuum system.

Medium-high-vacuum chambers can be used to produce high quality, low defect, ultra-thin graphitic layers on silicon carbide crystals when the silicon carbide crystals are placed in an enclosure within the vacuum system and when the enclosure is made of suitable materials. This is accomplished, for example, by placing the silicon carbide crystals in a graphite enclosure within the vacuum furnace.

In one experimental embodiment, the vacuum chamber was made of a non-conducting material, such as quartz. This chamber was evacuated through an opening using a turbomolecular vacuum pump. A silicon carbide crystal was placed in the graphite enclosure, which was covered with a graphite lid. The lid was perforated to allow gasses inside the chamber to escape. The graphite enclosure was mounted inside a conducting receptor, which was made of molybdenum. The receptor was inductively heated by radio frequency currents that were supplied to a copper coil that surrounded the vacuum chamber.

In another experimental embodiment, the chamber inert gasses were introduced into the chamber via a valve. The inert gas included high purity helium gas so that the gas pressure in the chamber was in the range of $10^{-4}$ millibar to 1.5 bars. The procedure used to produce the ultra-thin graphitic layers on the silicon carbide substrate was substantially the same as the procedure used in previously described embodiments.

One experimental embodiment employed the following steps.
1. One or more silicon carbide crystals were placed in the graphite enclosure and the graphite enclosure was closed with a lid.
2. The graphite enclosure assembly was then placed on the graphitic platform inside the chamber.
3. The chamber was sealed by a lid and the chamber was evacuated using a vacuum pump. The platform was positioned to the unheated zone in the chamber using the handle.
4. After a vacuum had been established so that the pressure in the vacuum chamber was at most $10^{-2}$ Torr, the heating elements were activated so that the heated zone attained a temperature required to produce ultra-thin graphitic layers on silicon carbide crystals, which in one example was 1430° C.
5. The platform and with it, the graphite enclosure that contained the silicon carbide crystals was positioned in the first heated zone using the handle for a predetermined duration of time. Then the graphite enclosure was moved to the third zone for a predetermined duration of time.
6. After the silicon carbide crystals had been exposed to the high temperatures for the predetermined time (which in one embodiment was 30 minutes), the graphite enclosure assembly was moved to the unheated zone in the chamber by means of the handle.
7. After the silicon carbide crystals had cooled to room temperature, they were removed from the vacuum chamber.

Various heating methods can be employed. In one embodiment heating is accomplished by radio frequency induction heating. In this well-known method a metallic susceptor is subjected to radiofrequency magnetic fields produced in a copper coil. These fields induced currents in the metallic susceptor causing the susceptor to heat. In one embodiment, the metallic susceptor consists of a metallic cylinder, made out of a refractory metal, for example molybdenum. The cylindrical graphite enclosure is placed in the susceptor and this assembly is placed in the chamber. An advantage of this embodiment is that heating is accomplished without significantly heating the walls of the chamber.

In an other embodiment, the heating is accomplished by heating the walls of the chamber, which therefore must be made of a material, for example alumina, that can withstand the high temperatures that are required in the processes involved to produce ultra-thin graphitic layers on silicon carbide. One advantage of this embodiment is that it is cost effective for processing larger silicon carbide crystals, for example silicon carbide wafers with diameters exceeding 1 inch, or several smaller silicon carbide crystals. Another advantage is that this method provides greater temperature homogeneity than can be achieved using the induction furnace method, for example temperature variations can be reduced to less than 2° C. over the area of the silicon carbide wafer. Experiments have determined that small temperature variations may be advantageous to produce uniform ultra-thin graphitic layers on the silicon carbide film. In this embodiment, the graphite enclosure can be surrounded by a molybdenum sheet that is, for example, 0.010 inches thick. The molybdenum sheet helps to remove residual gasses from the vacuum that may otherwise damage the ultra-thin graphitic film. This embodiment requires that the graphite enclosure can be mechanically moved inside the vacuum chamber so that it can be rapidly introduced to the high temperature zone of the furnace in order to expose the silicon carbide crystals to the required high temperatures. The reason for this provision is that the externally heated chamber may not be heatable to the required temperature rapidly enough as required in the ultra-thin graphitic formation process. In yet another embodiment, the silicon carbide crystal is heated by passing an electrical current through it.

The quality of ultra-thin graphitic films on silicon carbide may be enhanced by applying a hydrogen etch to the silicon carbide crystals prior to the graphitization process described above. Such hydrogen-etching includes heating the silicon carbide crystal in a hydrogen atmosphere. For example, the silicon carbide chip may be heated to a temperature in the range of 1400° C. to 1600° C. in an environment consisting of a gas mixture of 5% hydrogen and 95% argon (or helium) at a pressure of 1 atmosphere, for a time in the range of 5 minutes to 2 hours. The purpose of the hydrogen etch is to polish the silicon carbide crystal chemically to remove surface contaminants and surface oxides from the surface and also to remove scratches and other defects that were introduced in the fabrication of the silicon carbide wafer. One aspect of the invention is that it physically confines silicon that evaporates from the silicon carbide crystal, thereby controlling the rate of graphene formation.

The specific way that the individual layers are stacked with respect to each other is not essential for the purposes of this invention. For example, in graphite the layers may be Bernal stacked; while in multilayered epitaxial graphene grown on the C-face of silicon carbide, the stacking is rotationally disordered. This invention applies to any stacking order of the graphene sheets in the graphene layer.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of producing ultra-thin graphitic layers, comprising the actions of:
    a. placing a carbide crystal into a graphitic enclosure;
    b. placing the carbide crystal and the graphitic enclosure into a chamber;
    c. subjecting the carbide crystal and the graphitic enclosure to a predetermined environment;
    d. once the predetermined environment is established, heating the carbide crystal and the graphitic enclosure to a first temperature for a predetermined period of time sufficient to cause at least one non-carbon element to evaporate from a crystal face of the carbide crystal so as to form at least one graphitic layer on the crystal face of the carbide crystal; and
    e. reacting residual gaseous reactants in the graphitic enclosure that would act as impurities in the ultra-thin graphitic layers with the graphitic enclosure so as to transform such residual gaseous reactants into substances that will not add impurities to the ultra-thin graphitic layers; and
    f. placing the carbide crystal and the graphitic enclosure into a conductive receptacle, wherein the heating action includes inductively heating the conductive receptacle by applying radio frequency radiation to the conductive receptacle.

2. The method of claim 1, wherein the conductive receptacle comprises molybdenum.

3. The method of claim 1, further comprising the action of cleaning and flattening the crystal face of the carbide crystal.

4. The method of claim 3, wherein the cleaning and flattening action comprises the action of hydrogen etching the crystal face.

5. The method of claim 1, wherein the chamber comprises a vacuum chamber and wherein the predetermined environment comprises a vacuum.

6. The method of claim 1, wherein the subjecting action comprises evacuating the chamber to a predetermined vacuum having a pressure that is less than $10^{-2}$ Torr.

7. The method of claim 1, wherein the first temperature is in a range from 1200° C. to 1700° C.

8. The method of claim 1, further comprising the action of introducing an inert gas into the chamber during the heating action.

9. The method of claim 8, wherein the inert gas comprises helium.

10. The method of claim 1, wherein the carbide crystal comprises silicon carbide and wherein the non-carbon element comprises silicon.

11. The method of claim 1, wherein the chamber comprises a material selected from a group consisting of: quartz, alumina and combinations thereof.

12. The method of claim 1, further comprising the actions of:
    a. placing the carbide crystal and the graphitic enclosure in a second zone of the chamber that is heated to a second temperature, different from the first temperature; and
    b. moving the carbide crystal and the graphitic enclosure into a first zone of the chamber, spaced apart from the second zone, that is heated to the first temperature.

13. The method of claim 12, further comprising the action of moving the carbide crystal and the graphitic enclosure into a third zone of the chamber, spaced apart from the first zone and the second zone that is heated to a third temperature, different from the first temperature and the second temperature.

* * * * *